United States Patent
Bye et al.

(10) Patent No.: US 8,600,660 B2
(45) Date of Patent: Dec. 3, 2013

(54) MULTIPATH MODELING FOR DEEP INTEGRATION

(75) Inventors: Charles T. Bye, Eden Prairie, MN (US); Brian W. Schipper, Brooklyn Park, MN (US)

(73) Assignee: Honeywell International Inc., Morristown, NJ (US)

(*) Notice: Subject to any disclaimer, the term of this patent is extended or adjusted under 35 U.S.C. 154(b) by 2309 days.

(21) Appl. No.: 11/537,151

(22) Filed: Sep. 29, 2006

(65) Prior Publication Data

US 2008/0082266 A1    Apr. 3, 2008

(51) Int. Cl.
G01C 21/00    (2006.01)

(52) U.S. Cl.
USPC ........ 701/408; 701/478.5; 701/479; 701/480; 701/510; 701/536

(58) Field of Classification Search
USPC .............. 701/214, 400, 408, 468, 478.5, 479, 701/480, 500, 501, 505, 509, 510, 518, 534, 701/535, 536
See application file for complete search history.

(56) References Cited

U.S. PATENT DOCUMENTS

| | | | |
|---|---|---|---|
| 5,416,712 A * | 5/1995 | Geier et al. | 701/472 |
| 5,555,503 A * | 9/1996 | Kyrtsos et al. | 701/518 |
| 5,654,907 A | 8/1997 | Lange | 364/571.04 |
| 5,740,048 A * | 4/1998 | Abel et al. | 701/470 |
| 5,787,384 A * | 7/1998 | Johnson | 701/472 |
| 6,052,647 A | 4/2000 | Parkinson et al. | 701/215 |
| 6,202,033 B1 | 3/2001 | Lange | 702/104 |
| 6,417,802 B1 * | 7/2002 | Diesel | 342/357.31 |
| 6,424,914 B1 | 7/2002 | Lin | 701/214 |
| 6,496,778 B1 | 12/2002 | Lin | 701/215 |
| 6,664,923 B1 | 12/2003 | Ford | 342/357.12 |
| 6,691,066 B1 | 2/2004 | Brodie | 702/185 |
| 6,721,657 B2 | 4/2004 | Ford et al. | 701/213 |
| 6,772,100 B2 | 8/2004 | Lipp | 702/193 |
| 6,859,170 B2 | 2/2005 | Devereux et al. | 342/357.06 |
| 7,026,982 B2 | 4/2006 | Toda et al. | 342/357.04 |
| 2002/0116126 A1* | 8/2002 | Lin | 701/214 |
| 2002/0198656 A1* | 12/2002 | Ford et al. | 701/213 |
| 2004/0199833 A1* | 10/2004 | Brodie | 714/48 |
| 2005/0060069 A1* | 3/2005 | Breed et al. | 701/29 |
| 2005/0065722 A1* | 3/2005 | Wood et al. | 701/213 |

* cited by examiner

*Primary Examiner* — Khoi Tran
*Assistant Examiner* — Stephen Holwerda
(74) *Attorney, Agent, or Firm* — Fogg & Powers LLC

(57) ABSTRACT

A state is added to a Kalman filter to model GPS multipath errors. The multipath states may be modeled as either a random walk model or a Gauss-Markov process. The choice of the model depends on the characteristics of the multi-path error and the GPS receiver. Adding this state to the Kalman filter to model multipath improves the navigation system's robustness when operating as a deeply integrated system when multipath is present.

14 Claims, 4 Drawing Sheets

MULTIPATH MODELING FOR DEEP INTEGRATION

FIELD

The present invention relates generally to deep integration of an inertial navigation system and a global positioning satellite system, and more particularly, relates to modeling multipath states in a Kalman filter to improve deep integration performance in the presence of multipath.

BACKGROUND

A pilot receives information from many sources during take-off, flight, and landing of an aircraft. The aircraft includes avionic systems designed to collect data, perform calculations on the data, and present the data to the pilot. For example, the aircraft may include an inertial navigation system (INS), an air data computer, a roll-pitch-yaw computer, a mission computer, various displays, and other avionic systems.

Some avionic systems may include one or more sensors that collect data, such as attitude, heading, altitude, and air speed. For example the INS may include three orthogonally mounted acceleration sensors and three nominally orthogonally mounted inertial angular rate sensors, which can provide three-axis acceleration and angular rate measurement signals. The same or other avionic systems may process this data. Avionic displays may present the data to the pilot in a usable format.

The redundancy of information may improve the accuracy of some avionic systems. For example, the aircraft may include both an INS and a global positioning satellite (GPS) receiver, or other radio frequency (RF) ranging system, such as Time Difference of Arrival (TDOA) and Galileo. Both the INS and the GPS receiver may provide estimates of the aircraft's position. The data from the GPS receiver may be used to calibrate the INS, while the GPS receiver may use the data from the INS to quickly re-establish tracking of a satellite in which the GPS receiver has temporarily lost contact. Thus, the integration of the INS and GPS receiver provides more accurate and robust data to the pilot.

Deep integration of the INS and the GPS receiver is a technique in which the tracking loops of the GPS receiver are closed or driven as part of the operation of an integrated navigation INS/GPS Kalman filter. Kalman filtering is a statistical technique that combines knowledge of the statistical nature of system errors with knowledge of system dynamics, as represented as a state space model, to arrive at an estimate of the state of a system. The INS/GPS Deep integration Kalman filter processes measurements from the INS and all available satellites using in-phase (I) and quadrature (Q) signals. The Kalman filter calculates the errors and sends correction data to a navigation processor, which provides as an output a navigation solution. By combining information from multiple satellites and the INS, the deeply integrated system is able to track the satellites under higher interference or jamming levels.

One challenge that arises in a deeply integrated INS/GPS system is handling problems that may occur when the GPS signal dynamics are not kinematically consistent with vehicle dynamics. This inconsistency may occur because the Kalman filter is trying to closely match the behavior of the GPS tracking loop with what it observes from the INS. For example, the GPS signal dynamics may not be kinematically consistent with vehicle dynamics due to GPS signal multipath. With multipath, a signal arrives at the GPS receiver via multiple paths due to reflections from the Earth and nearby objects, such as buildings and vehicles. Multipath can cause swings in GPS pseudorange with no corresponding change in vehicle dynamics. These kinematic inconsistencies may cause the Kalman filter to lose track, which may result in an erroneous navigation solution.

Thus, it would be beneficial to design the Kalman filter to account for multipath error so that the Kalman filter can continue providing accurate estimates to the navigation processor despite multipath conditions.

SUMMARY

A deeply integrated navigation system that operates in the presence of multipath is described. The system includes a navigation processor and a Kalman filter. The navigation processor receives data from inertial sensors and computes a navigation solution. The Kalman filter includes a multipath error model. The Kalman filter receives the navigation solution and data from a GPS receiver and uses the navigation solution, the data from the GPS receiver, and the multipath error model to calculate an estimate that is provided to the navigation processor. For example, the multipath error model may be a random walk model or a Gauss-Markov process.

A method for improving deep integration performance of a navigation system in the presence of multipath is also described. In one example, the method includes receiving data from inertial sensors and a GPS receiver; modeling a multipath state in a Kalman filter; and calculating a navigation solution based on the received data and a navigation estimate that is calculated using the modeled multipath state. Modeling the multipath state may include using a random walk model or a Gauss-Markov process.

In another example, the method may include receiving data from inertial sensors and a GPS receiver; calculating a Kalman gain using a first error covariance matrix that includes a GPS short term error state; calculating a first estimate with the received data, the Kalman gain, and a state vector that includes the GPS short term error state; and calculating a second estimate and a second error covariance matrix using a state transition matrix that includes the GPS short term error state. The GPS short term error state may include multipath. The GPS short term error state may be modeled as a random walk model or a Gauss-Markov process.

These as well as other aspects and advantages will become apparent to those of ordinary skill in the art by reading the following detailed description, with reference where appropriate to the accompanying drawings. Further, it is understood that this summary is merely an example and is not intended to limit the scope of the invention as claimed.

BRIEF DESCRIPTION OF THE DRAWINGS

Presently preferred embodiments are described below in conjunction with the appended drawing figures, wherein like reference numerals refer to like elements in the various figures, and wherein.

DETAILED DESCRIPTION

Figure 1:
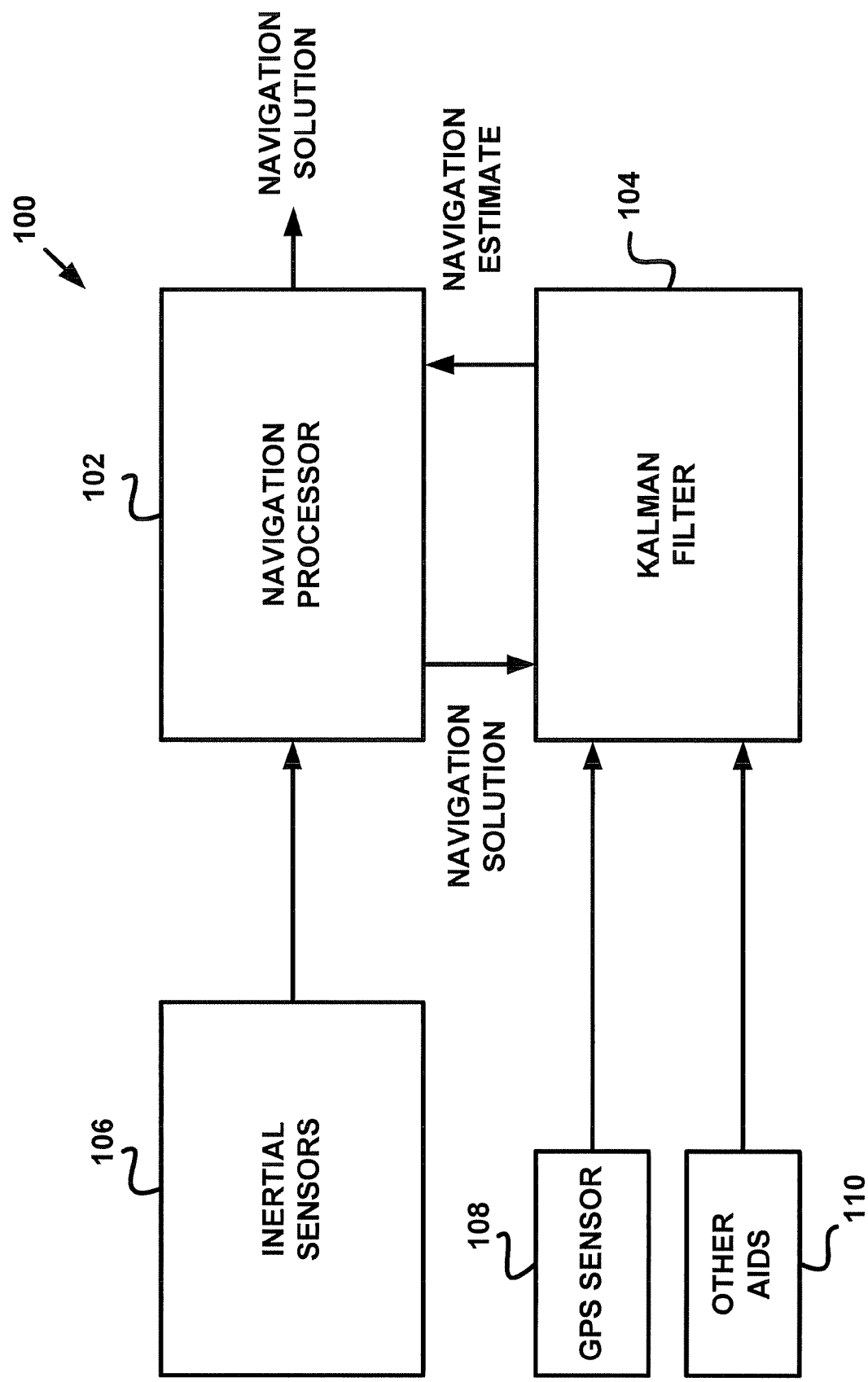
FIG. 1 is a block diagram of a navigation system, according to an example.

FIG. 1 is a block diagram of a navigation system 100. The navigation system 100 includes a navigation processor 102 and a Kalman filter 104. While the navigation processor 102 and the Kalman filter 104 are shown as separate entities in FIG. 1, the navigation processor 102 and the Kalman filter 104 can also be co-located as a single component. The navigation processor 102 receives inertial data from inertial sensors 106. The Kalman filter 104 receives data from one or more GPS sensors 108 and optionally from other aids 110.

Generally, the navigation processor 102 calculates a navigation solution, which is provided to the Kalman filter 104. The Kalman filter 104 may use the navigation solution to estimate navigation corrections. The Kalman filter 104 estimates are provided to the navigation processor 102, which may use the estimates to calculate a more accurate navigation solution.

The inertial sensors 106 provide acceleration and angular rate data to the navigation processor 102. Typically, the inertial sensors 106 include three orthogonally mounted acceleration sensors and three nominally orthogonally mounted inertial angular rate sensors, which can provide three-axis acceleration and angular rate measurement signals. Accordingly, the inertial sensors 106 may include three accelerometers and three gyroscopes. The three accelerometers may be any type of accelerometer, such as a force re-balance, resonating beam, or MEMS accelerometer. The three gyroscopes may be any type of gyroscope, such as a ring laser or MEMS gyroscope.

The navigation processor 102 may be any combination of hardware, firmware, and/or software operable to provide a navigation solution. The navigation solution may be a three-dimensional position, three-dimensional velocity, and three-dimensional attitude solution. However, the exact navigation solution may depend on the operational mode of the aircraft. Other avionics systems may use the navigation solution. For example, the aircraft's position may be displayed for the pilot on a head-up display.

The GPS sensor 108 may be a GPS receiver, Time Difference of Arrival (TDOA), Galileo, or any other radio frequency (RF) ranging system. It is understood that the term GPS sensor as used in this specification includes any RF ranging system. The GPS sensor 108 may provide three-dimensional position, velocity, and time (PVT) information. Additionally, the GPS sensor 108 may provide pseudorange and deltarange (PR/DR) information and/or in-phase and quadrature (I & Q) information. If multiple GPS sensors 108 are used with separate and suitably located antennas, then an estimate of heading may be computed using the information from the GPS sensors 108.

Additional aids may optionally provide data to the Kalman filter 104. For example, the other aids 110 may include a magnetometer. The magnetometer may detect the Earth's magnetic field. Data from the magnetometer may be used to determine the heading of the aircraft. This information may be used to initialize the navigation system 100 or to aid the navigation processor 102. The navigation processor 102 may use the heading information from the magnetometer in combination with GPS PVT information, GPS PR/DR information, GPS I & Q information, GPS-derived heading information, or inertial-derived heading information to provide an improved heading reading to the pilot.

The Kalman filter 104 may be any combination of hardware, firmware, and/or software operable to provide an estimate. Kalman filters are well known in the art for use in providing correction data to provide a more accurate navigation solution. The Kalman filter 104 may receive data from the navigation processor 102, the GPS sensor 108, and optionally the other aids 110 and estimate navigation corrections of the aircraft's position, velocity, attitude, and/or other vehicle states. The Kalman filter 104 may estimate navigation corrections using a model for each of the various error states. The Kalman filter 104 may provide the estimate to the navigation processor 102.

The Kalman filter 104 typically includes error models for navigation states, inertial sensor states, GPS clock states, and GPS range states. Error models for these states are well-known in the art and are not further described herein. The state estimates use a weighing function, called a Kalman gain, which is optimized to produce a minimum error variance.

It would be beneficial to add an additional error model to the Kalman filter to model the GPS multipath states. The multipath states may be modeled as a random walk or a Gauss-Markov process. By adding the error model for multipath (and other short term error states as further described), the Kalman filter 104 may continue operating despite multipath conditions.

Figure 2:
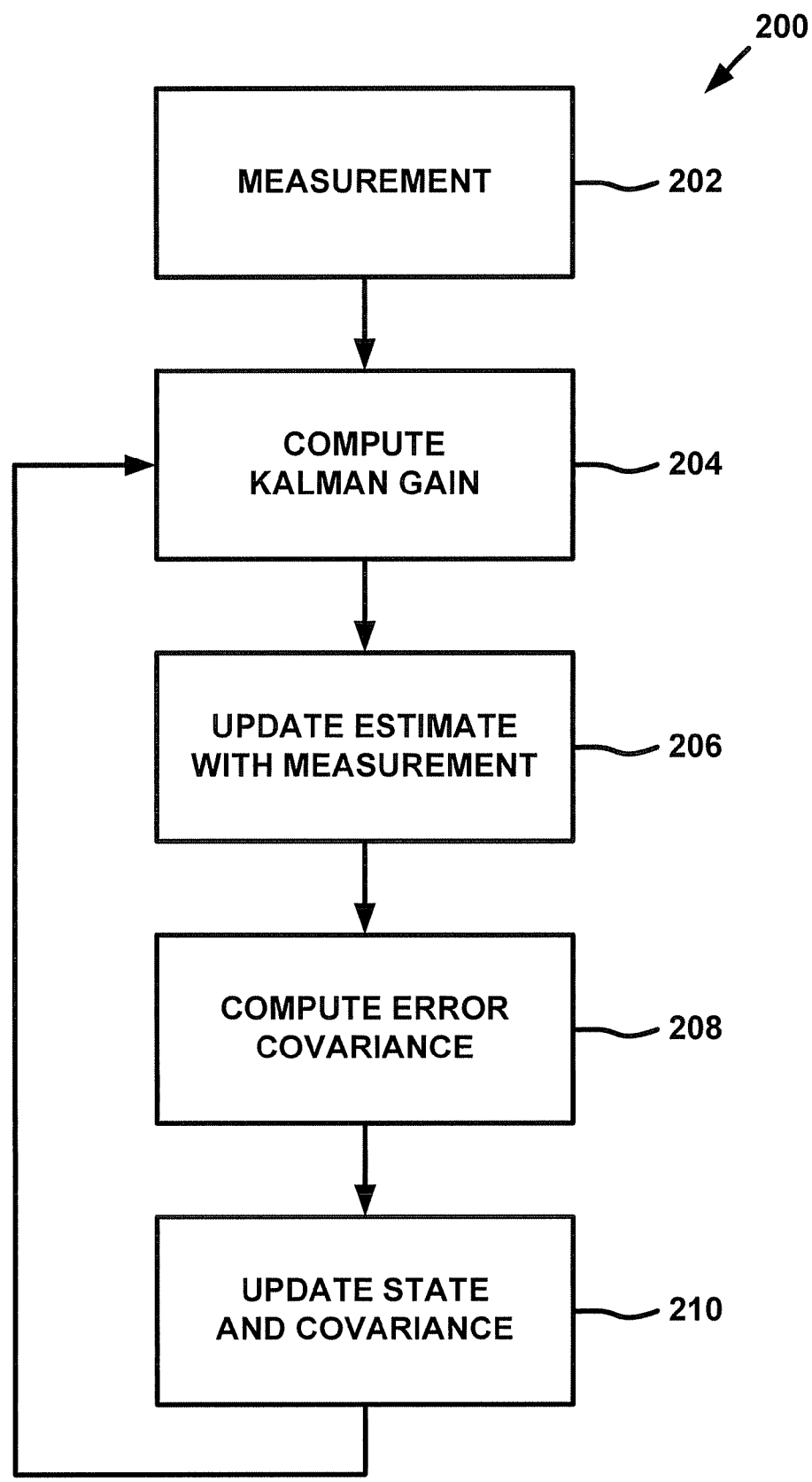
FIG. 2 is a flow diagram depicting a Kalman filter process that includes multipath modeling, according to an example.

FIG. 2 is a flow diagram depicting a Kalman filter process 200 that includes multipath modeling. At block 202, a measurement is obtained. The measurement may be received from the inertial sensors 106 and the GPS sensor 108. Additional measurements may be obtained from the other aids 110.

At block 204, a Kalman gain, Kn, is calculated. The Kalman gain matrix contains statistical parameters needed to combine the prior estimate and the new data, resulting in a minimum error variable estimate. For example, the Kalman gain matrix may be calculated as follows:

$$K_n = P_n^- H_n^T (H_n P_n^- H_n^T + R_n)^{-1} \quad (1)$$

where P is a error covariance matrix, H is a measurement matrix, and R is a measurement noise covariance matrix. The error covariance matrix P is a measure of the estimated accuracy of the state estimate. The elements in the measurement matrix H relate observations to the state vector. In this example, the observations include multipath error observations. The measurement noise covariance matrix R is received with the pseudorange and pseudorange rate measurements from the GPS sensor 108.

Figure 3:
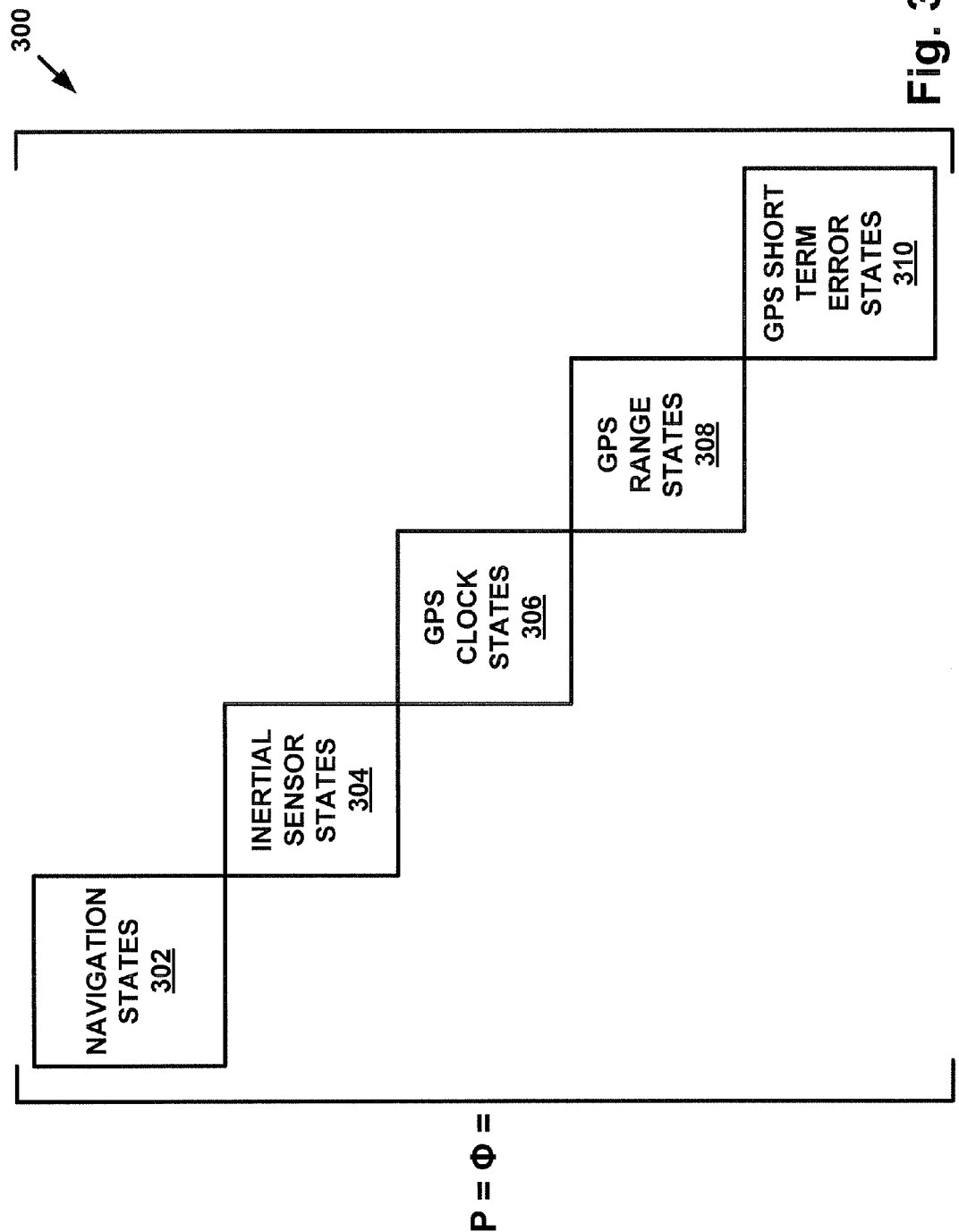
FIG. 3 is an error covariance or state transition matrix that includes GPS short term error states, according to an example.

An example error covariance matrix 300 is depicted in FIG. 3. The error covariance matrix 300 is a matrix with entries above and below the principle diagonal equal to zero (not shown). The diagonal elements represent error models for navigation states 302, inertial sensor states 304, GPS clock states 306, GPS range states 308, and GPS short term error states 310. If other aids are used, the error covariance matrix 300 may include error models for these other aids as well. The GPS short term error states 310 include multipath.

The GPS short term error states 310 may be modeled as a random walk model with an initial value and standard deviation or as a second order lightly damped Gauss-Markov process with a standard deviation and auto-correlation time. The exact model type and its values are chosen based on the error source being modeled, such as atmospheric or multipath errors. For example, if the GPS short term error states 310 are modeling multi-path and the GPS receiver is of average quality, then a reasonable choice for the error model would be a second order lightly damped Gauss-Markov process with a standard deviation of 10 meters and auto-correlation time of 100 seconds.

Figure 4:
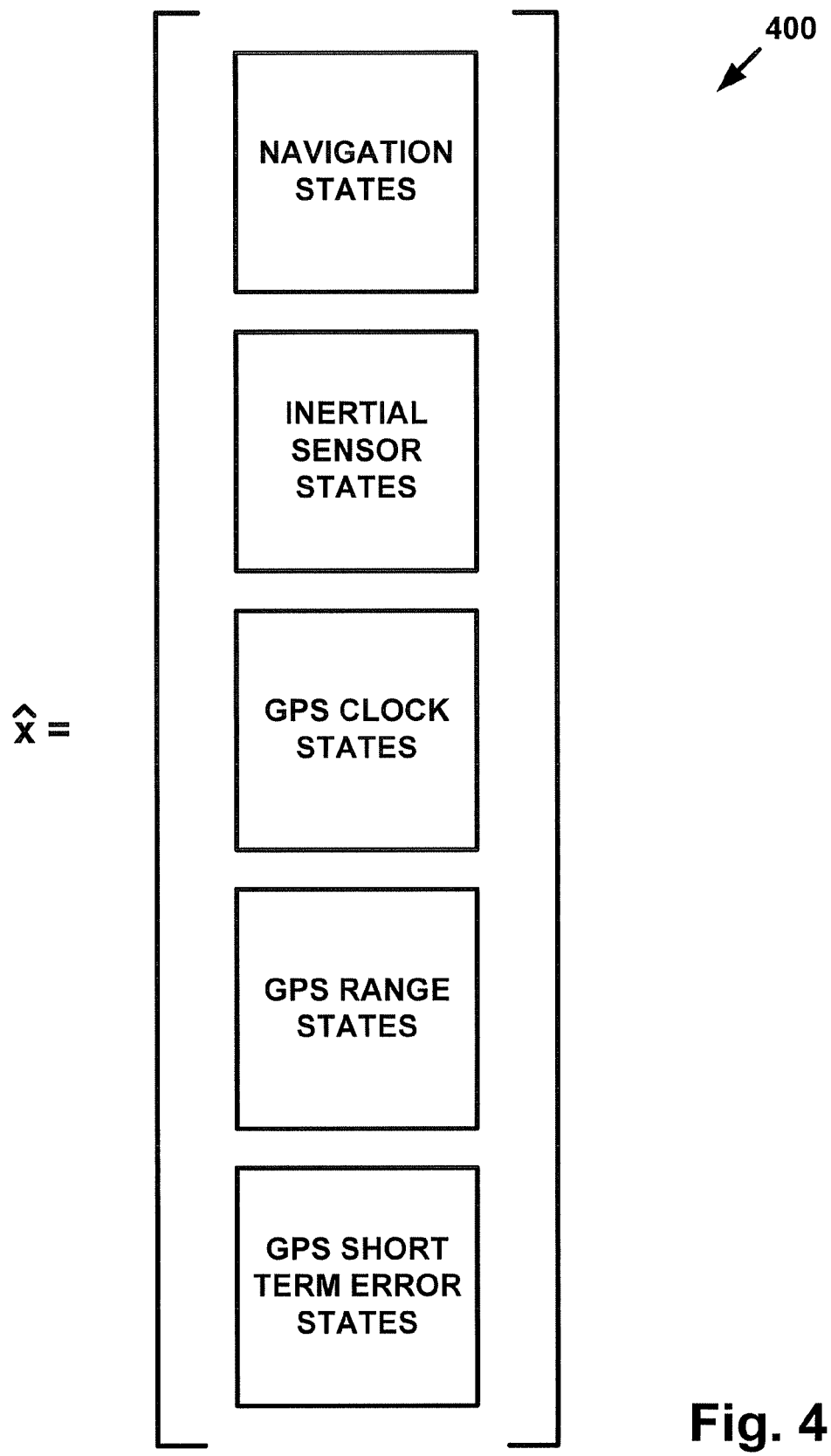
FIG. 4 is a state vector that includes GPS short term states, according to an example.

At block 206, an estimate is updated with the measurement. The state vector, $\hat{x}_n$, is the estimate of the state at time n and can be calculated using a measurement update equation that corrects the prior estimate with the addition of new information contained in the measurement. An example measurement update equation is:

$$\hat{x}_n = \hat{x}_n^- K_n(Z_n - H_n\hat{x}_n^-) \quad (2)$$

where Z is the measurement vector, which is a set of vector measurements for a given time n. An example state vector 400 is depicted in FIG. 4. The state vector 400 includes GPS short term error states. The GPS short term states include the multipath states.

At block 208, an error covariance matrix is computed. After the measurement update, the error covariance matrix P is reduced according to:

$$P_n = (1 - K_n H_n) P_n^- \quad (3)$$

At block 210, the estimate and error covariance matrix are updated using the following equations:

$$\hat{x}_{n+1}^- = \Phi_n \hat{x}_n \quad (4)$$

$$P_{n+1}^- = \Phi_n P_n \Phi_n^T + Q_n \quad (5)$$

where $\Phi$ is a state transition matrix and Q is a process noise covariance matrix. The state transition matrix, $\Phi$, specifies how the covariance matrix will be propagated based on the error equations for the navigation algorithms and the other states (e.g. GPS clock, multipath). The navigation error equations and error equations for the other states used in the propagation of transition matrix, $\Phi$, are well known to one skilled in the art.

The process noise covariance matrix, Q, is a matrix with entries above and below the principle diagonal equal to zero. The diagonal elements represent the noise variances in the GPS receiver in the measurement of pseudorange and pseudorange rate. The updated state and covariance calculated using equations (4) and (5) may be provided to the navigation processor 102 for calculation of the navigation solution.

The Kalman filter 104 is a recursive estimator, meaning that only the estimated state from the previous time step and the current measurement are needed to compute the estimate of the current state. Accordingly, the Kalman filter process 200 continues at block 204 using a new measurement received from block 202.

While the Kalman filter process 200 was described with respect to improving deep integration performance in the presence of GPS signal multipath, it is understood that the same technique may be used to improve performance in the presence of any time varying pseudorange error. For example, the technique may be used to overcome problems with selective availability. While not currently a concern because it is disabled, selective availability is the error that the government previously induced in civilian GPS pseudorange measurements to reduce accuracy.

It should be understood that the illustrated embodiments are examples only and should not be taken as limiting the scope of the present invention. The claims should not be read as limited to the described order or elements unless stated to that effect. Therefore, all embodiments that come within the scope and spirit of the following claims and equivalents thereto are claimed as the invention.

We claim:

1. A navigation system that operates in the presence of multipath, comprising:
    a navigation processor that receives data from inertial sensors and computes a navigation solution; and
    a Kalman filter that includes a multipath error model, wherein the Kalman filter receives the navigation solution and data from a global positioning satellite (GPS) receiver, and uses the navigation solution, the data from the GPS receiver, and the multipath error model to calculate an estimate that is provided to the navigation processor.

2. The system of claim 1, wherein the multipath error model is a random walk model.

3. The system of claim 1, wherein the multipath error model is a Gauss-Markov process.

4. A method for improving navigation system performance in the presence of multipath, comprising:
    receiving data from inertial sensors and a global positioning satellite (GPS) receiver;
    modeling a multipath state in a Kalman filter; and
    calculating a navigation solution based on the received data and a navigation estimate that is calculated using the modeled multipath state.

5. The method of claim 4, wherein modeling the multipath state includes using a random walk model.

6. The method of claim 4, wherein modeling the multipath state includes using a Gauss-Markov process.

7. A method for improving navigation system performance in the presence of multipath, comprising:
    receiving data from inertial sensors and a satellite based navigation system receiver;
    calculating a Kalman gain using a first error covariance matrix that includes a multipath error state;
    calculating a first estimate with the received data, the Kalman gain, and a state vector that includes the multipath error state; and
    calculating a second estimate and a second error covariance matrix using a state transition matrix that includes the multipath error state.

8. The method of claim 7, wherein the Kalman gain K is calculated as follows:

$$K_n = P_n^- H_n^T (H_n P_n^- H_n^T + R_n)^{-1}$$

where P is the error covariance matrix, H is a measurement matrix, and R is a measurement noise covariance matrix.

9. The method of claim 7, wherein the multipath error state is modeled as a random walk model.

10. The method of claim 7, wherein the multipath error state is modeled as a Gauss-Markov process.

11. The method of claim 7, wherein the first estimate $\hat{X}_n$ is calculated as follows:

$$\hat{x}_n = \hat{x}_n^- + K_n(Z_n - H_n\hat{x}_n^-)$$

where K is the Kalman gain, Z is a measurement vector, and H is a measurement matrix.

12. The method of claim 7, wherein the first error covariance matrix P is calculated as follows:

$$P_n = (1 - K_n H_n) P_n^-$$

where K is the Kalman gain and H is a measurement matrix.

13. The method of claim 7, wherein the second estimate $\hat{x}_n$ is calculated as follows:

$$\hat{x}_{n+1}^- = \Phi_n \hat{x}_n$$

where $\Phi$ is the state transition matrix.

14. The method of claim 7, wherein the second error covariance matrix P is calculated as follows:

$$P_{n+1}^- = \Phi_n P_n \Phi_n^T + Q_n$$

where $\Phi$ is the state transition matrix and Q is the process noise covariance matrix.

* * * * *